United States Patent [19]

Kuisl

[11] Patent Number: 4,650,693

[45] Date of Patent: Mar. 17, 1987

[54] METHOD FOR PRODUCING AN AEROSOL STREAM

[75] Inventor: Max Kuisl, Ulm, Fed. Rep. of Germany

[73] Assignee: Licentia Patent-Verwaltungs-GmbH, Frankfurt am Main, Fed. Rep. of Germany

[21] Appl. No.: 757,860

[22] Filed: Jul. 22, 1985

[30] Foreign Application Priority Data

Jul. 25, 1984 [DE] Fed. Rep. of Germany ....... 3427323

[51] Int. Cl.$^4$ .............................................. B05D 1/04
[52] U.S. Cl. ...................................... 427/27; 427/162; 427/163; 427/166; 427/167; 427/168; 65/3.11; 65/3.12; 65/3.20
[58] Field of Search ................. 427/27, 162, 163, 166, 427/167, 168; 65/3.11, 3.12, 3.20

[56] References Cited

U.S. PATENT DOCUMENTS

| | | | |
|---|---|---|---|
| 4,083,708 | 4/1978 | Heath | 65/3.2 |
| 4,090,055 | 5/1978 | King | 65/3.2 |
| 4,148,621 | 4/1979 | Gliemeroth | 65/3.12 |
| 4,224,046 | 9/1980 | Izawa | 65/3 A |
| 4,233,045 | 11/1980 | Sarkar | 65/3.12 |
| 4,378,987 | 5/1983 | Miller | 65/3.12 |
| 4,440,558 | 4/1984 | Nath | 65/3.12 |

FOREIGN PATENT DOCUMENTS 2333628 7/1977 France .
2496231 6/1982 France .
2118320 10/1983 United Kingdom .

OTHER PUBLICATIONS

Simpkins et al, "Thermophoresis: The Mass Transfer Mechanism in Modified Chemical Vapor Deposition", J. Appl. Phys., Sep. 1979, pp. 5676–5681.

Primary Examiner—Richard Bueker
Attorney, Agent, or Firm—Spencer & Frank

[57] ABSTRACT

A process for producing an aerosol stream, which is conducted through an essentially aerosol-free vapor and/or gas stream to prevent undesirable precipitation of particles contained in the aerosol stream, is augmented by additionally employing thermophoresis. For this purpose, the vapor and/or gas stream is heated to a temperature which is higher than the temperature of the aerosol stream. Thermophoresis then causes the particles to be held within the aerosol stream.

9 Claims, 1 Drawing Figure

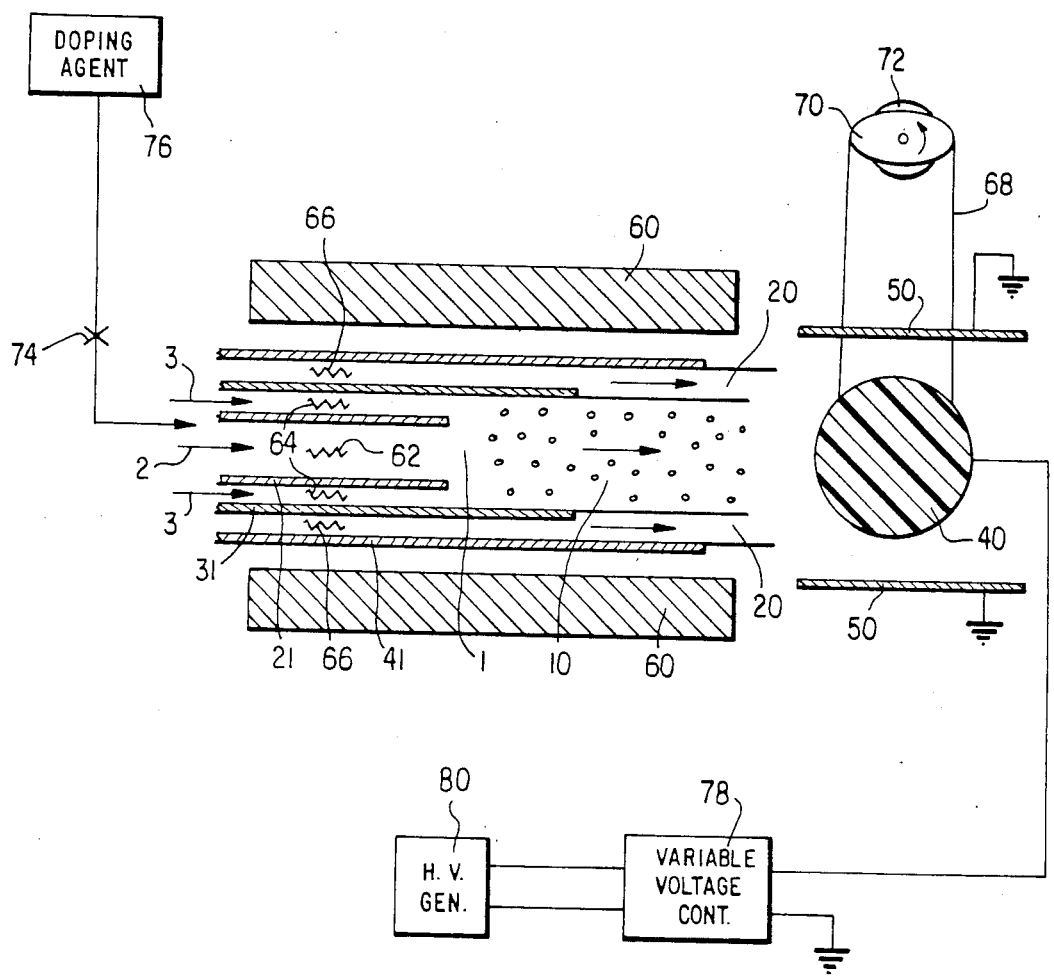

METHOD FOR PRODUCING AN AEROSOL STREAM

BACKGROUND OF THE INVENTION

The present invention relates to a method for producing an aerosol stream from a mixture of gas and/or vapor by way of a flame-free chemical reaction, the aerosol stream being conducted through an essentially aerosol-free stream of gas and/or vapor.

Such a method is disclosed in copending U.S. application Ser. No. 632,291, now U.S. Pat. No. 4,597,983, filed on July 19th, 1984 by Reinhard Kühne and Max Kuisl and entitled METHOD FOR PRODUCING A DIRECTED AEROSOL STREAM AND ITS USE, this prior application being assigned to the assignee of the present invention. The method of the prior application will be described in more detail in the following paragraphs.

As the prior application explains, aerosols containing solid particles may be referred to as fumes and aerosols containing gases or vapors as well as liquid particles are also called fogs. An exemplary process for producing a flowing aerosol, hereinafter called an aerosol stream, provides that gaseous and/or vaporous chemical components are mixed with the aid of a diffusion process and/or a turbulent mixing process and the resulting gas and/or vapor mixture is converted by thermal reaction into an aerosol stream.

In an aerosol stream, the solid or liquid particles move at various angles and in various directions. An aerosol stream of this sort is often uneconomical to use when a directed stream is needed, e.g., in manufacturing facilities which do coating, where only the articles to be coated with the particles are to be covered and not their surroundings. Such an aerosol stream may be directed by mechanical means, e.g., using baffles. However, this procedure is uneconomical, since the baffles are also coated by the aerosol particles, resulting in losses of the aerosol and requiring expensive cleaning procedures.

With reference to the FIGURE, the prior application describes an aerosol generator which includes concentrically arranged pipes or conduits 21, 31, and 41, each having a cross section which is adapted to the intended use of the generated aerosol stream. For example, the cross section of the conduits may be selected to be circular or rectangular. The inner conduits 21 and 31 initially conduct gaseous and/or vaporous components in laminarly flowing streams symbolized by arrows 2 and 3, into a reaction chamber 1. In chamber 1 diffusion produces a gas and/or vapor mixture which is converted by chemical reaction to an aerosol, the aerosol stream 10. This chemical reaction may be initiated, for example, by the heat generated in a furnace 60 arranged around reaction chamber 1. The resulting, essentially laminar flow aerosol stream 10 is now conducted with an envelope of an aerosol particle free gas and/or vapor stream 20, which is introduced to surround the aerosol stream 10 through the outer concentric conduit 41. The gas and/or vapor stream 20 in essentially laminar flow prevents radial movement of the particles contained in the aerosol stream 10. This makes it possible, particularly in coating systems, to shape the cross section of aerosol stream 10 by way of nozzles to precisely direct the aerosol stream and to make the coating processes economical. The particle free gas and/or vapor stream 20, in particular, prevents clogging of the nozzles, the walls of the reaction chamber, and some eventually necessary baffels by preventing the aerosol from contacting the appropriate surfaces and thus avoids costly cleaning work. The shape of the nozzle is calculated and/or experimentally determined according to the body 40 that is to be coated. E.g. for the manufacturing of so called preforms for optical fibers it is necessary to coat the outer surface of a barlike body with several glassy layers. In that case the end of the outer concentric conduit 41 has a nozzle that is part of a tube with a rectangular cross-sectional area. This cross-sectional area has the same length and the same width as the barlike body.

In the prior art application, the body 40 to be coated is surrounded by aerodynamic guide elements 50 in such a manner that almost all particles contained in aerosol stream 10 impinge on body 40 and in this manner permit economical coating.

To enhance the rate of precipitation and reduce waste, the prior application advises that it is possible to generate an electrical field between body 40 and guide elements 50 by which the particles contained in aerosol stream 10 are guided onto body 40. If these particles are of a dielectric nature, e.g., glass, it is possible to form the electrical field in such a manner that electrical dipoles are produced in the particles which enhance the coating of body 40. Such dipoles avoid electrostatic charges in body 40 that would make further coating difficult. The electric field is generated by a commercially available high-tension direct-current- or alternating-current generator which can produce an electric field of about 20 kV/cm between the guide elements 50 and the body 40. The body 40 is connected to either pole (positive or negative) of the generator whereas the other pole and the guide elements 50 are grounded. In this way an inhomogeneous electrical field is generated which polarizes the particles of the aerosol stream. In such a field the polarized particles are attracted by the body 40.

The prior application discusses an example wherein body 40 is formed as a rod or tube carrier body whose outer jacket surface is to be coated with a vitreous and/or glass forming coating in such a manner that a so-called preform results from which light waveguides, i.e., optical fibers, can be drawn. This drawing process consists of the following steps. The glassy and tubelike preform has a length of about 1 m and an outer diameter of about 10 cm. The thickness of the wall of the tube and the refractive index are chosen according to the optical fiber to be drawn, e.g. a graded index fiber with an outer diameter of about 125 $\mu$m. The preform is heated at one end in such a way that it collapses and a fiber can be drawn out of this end.

In this example, the prior application advises, body 40 is rotated about its longitudinal axis and conduits 21, 31, and 41 have rectangular cross sections so that simultaneous coating along a circumferential line of body 40 is possible. The constituents symbolically represented by arrows 2 and 3 comprise silicon tetrachloride ($SiCl_4$) and water vapor ($H_2O$), respectively, which are converted in reaction chamber 1 under the influence of heat to a silicon dioxide ($SiO_2$) containing aerosol stream according to the following formula:

$$SiCl_4 + 2\ H_2O \rightarrow SiO_2 + 4\ HCl$$

This aerosol stream is guided within a gas and/or vapor stream 20 containing an inert gas, e.g. $N_2$. By adding doping substances, e.g., germanium tetrachloride (GeCl4), to the gaseous silicon tetrachloride, it is possible to precipitate doped glass layers ont the carrier body. The respective flow rates within conduits 21, 31, and 41 are selected in such a manner that, on the one hand, a laminar flow is maintained but, on the other hand, rediffusion from reaction chamber 1 into the conduits is avoided. This prevents undesirable particle deposition in conduits 21, 31, and 41. For example this can be achieved under the following conditions. To produce the aerosol stream 10 a gaseous mixture is led to the reaction chamber with a cross-sectional area of 120 cm$^2$ which is heated to about 800° C. The gaseous mixture contains nitrogen (N$_2$) as a carrier gas at a flow rate of about 240 liter/h, gaseous SiCl$_4$ at a flow rate of about 100 liter/h, water vapor at a flow rate of about 200 liter/hr and gaseous GeCl$_4$ as doping material at a flow rate of up to 10 liter/h. The flow rate of GeCl$_4$ is altered to produce the desired index-profile of the optical fiber. The gas and/or vapor stream 20 consists of gaseous N$_2$ at a flow rate of about 900 liter/h. In the reaction chamber 1 there is a resulting velocity of flow of about 1 cm/sec. The mentioned chemical reaction produces Ge-doped or undoped SiO$_2$-particles with a diameter of about 0.2 $\mu$m and a density of about $5 \times 10^{10}$ particles/cm$^3$. In the reaction chamber 1 the mixture of gaseous GeCl$_4$ and gaseous SiCl$_4$ reacts to homogeneously doped particles. The reaction of GeCl$_4$+2 H$_2$O→GeO$_2$+4 HCl is analogous to that of SiCl$_4$ with H$_2$O. Therefore the desired relation of GeO$_2$ to SiO$_2$ in the preform is exactly related to the adjustable relation of gaseous GeCl$_4$ to gaseous SiCl$_4$. For preforms for optical fibers it is necessary to rotate the body 40 around its axis to achieve glassy layers of homogenous thickness. If this rotation is not done continuously one obtains a layer with an alternating thickness, e.g. with an elliptical cross-sectional shape. The resulting optical fiber can be used for transmitting polarized light without altering the kind of polarization.

If the body 40 has another form, e.g. a disk or ball like form, the prior application advises that the dimensions of the reaction chamber, the nozzle and the gasflows have to be changed respectively.

From the foregoing discussion it will be apparent that the prior application describes a method which can be used, inter alia, to make a preform that is employed for producing optical fibers made of quartz glass, which may be doped. For this purpose body 40 may be a graphite rod which is rotated on its longitudinal axis and simultaneously coated with glass soot along its length. The glass soot, which precipitates on the rod, is provided by an aerosol stream which contains the glass soot and which has a cross section adapted to that of the rod. For example if the graphite rod is one meter long and three centimeters wide, the aerosol stream might have a rectangular cross section that is likewise one meter long and three centimeters wide. For this purpose the concentrically arranged pipes 21, 31, and 41 would also have rectangular cross sections. It will also be apparent that aerosol-free gas or vapor stream 20 surrounding aerosol stream 10 permits guidance of stream 10 and prevents glass soot from being deposited at undesirable locations, e.g., in reaction chamber 1. Stream 20 thus makes it possible to precipitate the glass soot outside furnace 60, which surrounds chamber 1. One advantage of this is that it is not necessary to make the rotatable mount for body 40 heat resistant. After precipitation of the glass soot, sintering takes place so that a quartz glass tube is produced; optical fiber can be drawn from the tube.

SUMMARY OF THE INVENTION

It is the object of the present invention to provide suitable modifications of the method of the aforesaid prior application, discussed in the Background section.

This object can be attained by heating at least one of the gaseous and/or vapor components, before introduction thereof into the reaction chamber, to a temperature which essentially corresponds to the reaction temperature for processing the aerosol, while the essentially aerosol-free gas and/or vapor stream is heated to a temperature higher than the reaction temperature.

BRIEF DESCRIPTION OF THE DRAWINGS

The sole FIGURE is a sectional side view schematically illustrating an improved aerosol generator according to the present invention.

DESCRIPTION OF THE PREFERRED EMBODIMENTS

The present invention is based on the realization that small particles can be moved with the aid of a temperature gradient. Such a process is known by the term "thermophoresis". The term thermophoresis is a compound term for temperature dependent motion, such as, for example, thermodiffusion as well as thermo-osmosis.

The aforesaid prior application discussed in the Background section indicates that undesirable precipitation of particles from aerosol stream 10 is avoided by the essentially aerosol-free vapor and/or gas stream 20 which surrounds aerosol stream 10 and guides it. This effect can be supported by thermophoresis. If, for example, the aerosol-free vapor and/or gas stream 20 and/or the walls of pipe 41 surrounding stream 20 are heated to a temperature higher than the temperature of aerosol stream 10, radially directed forces are generated which move the particles contained in the aerosol stream toward the longitudinal axis of aerosol stream 10. Annoying coating, particularly of the walls of reaction chamber 1, possibly of some nozzles and of guide elements 50, is avoided.

In the example mentioned in the prior application for generating SiO$_2$ particles from gaseous SiCl$_4$ and gaseous H$_2$O, it is possible, for example, to heat the components SiCl$_4$ and H$_2$O individually to the required reaction temperature of about 800° to 1000° C. and to then mix the heated components in reaction chamber 1 so that aerosol stream 10 is produced. To accomplish this heating, the FIGURE schematically illustrates heating element 62 in pipe 21 and 64 in pipe 31. The illustrated furnance 60 then serves merely to heat the walls of pipes 21, 31, 41 and/or vapor and/or gas stream 20 to a temperature which is higher than the reaction temperature, e.g., to 1200° C. If desired, the aerosol-free stream 20 may be further heated, as is illustrated schematically by heating elements 66 in pipe 41, to enhanace the thermophoresis effect.

Particularly for optical fibers having polarization retaining optical characteristics, it is necessary to produce an optically, not rotationally, symmetrical SiO$_2$ precipitation on a rod-shaped body 40, e.g., on an already existing preform body having a length of approximately 1 meter and a diameter of 5 cm. To do this, it is necessary to control and/or regulate the precipitation in dependence on the angle of rotation of body 40. This can be done in many ways, e.g., by nonuniform rotation of body 40 and/or by nonuniform addition of doping agent to the SiCl$_4$ and/or by changing the above-mentioned electrical field. In this way it is possible, for example, to produce an optical fiber which has an optically effective elliptical cross section. Nonuniform rotation can be accomplished, for example, by rotating the mount (not illustrated) for body 40 via a belt 68 driven by suitable cam-type pulley 70 which is, in turn, rotated by a gear motor 72. Nonuniform addition of doping agent might be accomplished by controlling valve 74, in a pipeline which connects a doping agent source 76 to pipe 21, in synchronism with the rotation of body 40. Finally, changing the electrical field might be accomplished by inserting a variable voltage controller 78 between high voltage generator 80 and body 40, controller 78 varying the potential at body 40 in synchronism with the rotation thereof.

When the rotational speed of body 40 or the strength of the above mentioned electrical field is altered in synchronism with the rotational angle of body 40 then both an optically and physically asymmetric, e.g. elliptic, cross section of body 40 is formed. whereas nonuniform addition of doping agent, e.g. GeCl$_4$, has no influence on the deposition rate and therefore on the rotational symmetric shape of the cross section. In this case only an optically asymmetric cross section results. This can be done by increasing the flow rate of the doping agent, e.g. GeCl$_4$, and simultaneously decreasing the flow rate of the glass forming component SiCl$_4$ whereby both flow rates depend on the rotational angle of body 40 too.

It will be understood that the above description of the present invention is susceptible to various modifications, changes and adaptations, and the same are intended to be comprehended within the meaning and range of equivalents of the appended claims.

What is claimed is:

1. A method for producing a directed aerosol stream from gaseous and/or vapor phase reactants, comprising:
    (a) heating at least one of the reactants to a temperature which essentially corresponds to the reaction temperature for producing the aerosol;
    (b) introducing the reactants into a reaction chamber after step (a);
    (c) reacting the reactants in the reaction chamber to produce an aerosol composition and allowing the aerosol composition to pass from the reaction chamber; and
    (d) immediately surrounding the aerosol composition with a moving, essentially aerosol-free gas and/or vapor stream that has been heated to a temperature which is higher than the reaction temperature, whereby a directed aerosol stream envelope in an aerosol-free gas and/or vapor stream is formed.

2. The method of claim 1, further comprising placing in said aerosol stream a body to be coated, and wherein step (d) comprises heating said essentially aerosol-free gas and/or vapor stream to a temperature at which the particles of the aerosol are held within the aerosol stream by thermophoresis so that precipitation of the particles at predetermined locations that are spaced apart from said body to be coated is avoided.

3. The method of claim 1, wherein walls surround at least one of the aerosol stream and said essentially aerosol-free gas and/or vapor stream, and further comprising placing in said aerosol stream a body to be coated, and wherein step (d) comprises heating said walls to a temperature at which the particles of the aerosol are held within said aerosol stream by thermophoresis so that precipitation of the particles at predetermined locations that are spaced apart from said body is minimized.

4. The method of claim 1, further comprising placing in said aerosol stream a body to be coated, said body being rotatably mounted, and controlling the coating in dependence on the angle of rotation of the body by varying the rotational velocity thereof.

5. The method of claim 1, wherein said aerosol is doped, and further comprising placing in said aerosol stream a body to be coated, said body being rotatably mounted, and controlling the coating in dependence on the angle of rotation of the body by varying the doping.

6. The method of claim 1, further comprising placing in said aerosol stream a body to be coated, said body being rotatably mounted in an electric field, and controlling the coating in dependence on the angle of rotation of the body by varying the intensity of the electric field.

7. The method of claim 1, further comprising placing in said aerosol stream a body to be coated with vitreous layers to produce a preform for optical fibers.

8. The method of claim 1, further comprising placing in said aerosol stream a body to be coated with glass forming layers to produce a preform for optical fibers.

9. The method of claim 1, further comprising placing in said aerosol stream a body to be coated, said body being rotatably mounted, and precipitating layers on said body in dependence on the angle of rotation thereof to produce a preform for an optical fiber having an optically but not rotationally symmetrical cross section.

* * * * *